United States Patent
Shi et al.

(10) Patent No.: US 10,676,846 B2
(45) Date of Patent: Jun. 9, 2020

(54) PROCESSES FOR PREPARING AMINE-FUNCTIONALIZED CELLULOSE NANOCRYSTALS AND NITROGEN DOPED CARBON NANOFIBERS

(71) Applicant: CELLUFORCE INC., Montréal, Québec (CA)

(72) Inventors: Zengqian Shi, Waterloo (CA); Xinyun Wu, Kitchener (CA); Kam Chiu Tam, Waterloo (CA); Richard Berry, Notre-Dame-de-l'Île-Perrot (CA)

(73) Assignee: CELLUFORCE INC., Montreal, Quebec (CA)

(*) Notice: Subject to any disclaimer, the term of this patent is extended or adjusted under 35 U.S.C. 154(b) by 128 days.

(21) Appl. No.: 15/747,561

(22) PCT Filed: Jul. 28, 2016

(86) PCT No.: PCT/CA2016/050888
§ 371 (c)(1),
(2) Date: Jan. 25, 2018

(87) PCT Pub. No.: WO2017/015761
PCT Pub. Date: Feb. 2, 2017

(65) Prior Publication Data
US 2018/0216256 A1 Aug. 2, 2018

Related U.S. Application Data

(60) Provisional application No. 62/197,815, filed on Jul. 28, 2015.

(51) Int. Cl.
*D01F 9/28* (2006.01)
*C08J 3/12* (2006.01)
(Continued)

(52) U.S. Cl.
CPC ........... *D01F 9/28* (2013.01); *C08J 3/126* (2013.01); *C30B 29/58* (2013.01); *C30B 33/00* (2013.01);
(Continued)

(58) Field of Classification Search
CPC ..... D01F 9/28; D01F 9/16; C08J 3/126; C08J 2301/02; C08J 2461/24; C08J 2461/28; C30B 29/58; C30B 33/00; B82Y 30/00
See application file for complete search history.

(56) References Cited

U.S. PATENT DOCUMENTS

2015/0322191 A1  11/2015  Hamad et al.

FOREIGN PATENT DOCUMENTS

CA      2890 653 A1   5/2014

OTHER PUBLICATIONS

Giese et al., "Imprinting of Photonic Patterns with Thermosetting AminoFormaldehyde-Cellulose Composites", ACS Macro Lett. 2013, 2, 818-821. (Year: 2013).*

(Continued)

*Primary Examiner* — Anthony J Zimmer
(74) *Attorney, Agent, or Firm* — Bryan D. Zerhusen, Esq.; Nicholas R. Herrel, Esq.; Cantor Colburn LLP

(57) ABSTRACT

The present disclosure relates to a process for preparing coated cellulose nanocrystals (CNCs) and relates as well to coated cellulose nanocrystals (CNCs) obtainable by the process described herein. These new CNC hybrid nanomaterials are expected to be useful, for example, for the conjugation and electrostatic complexation with various functional moieties such as free metal ions, carboxylic acids, and epoxy and aldehyde derivatives. The disclosure further relates to a method to fabricate N-doped carbon nanomaterial from the coated CNCs.

27 Claims, 4 Drawing Sheets

(51) Int. Cl.
    *C30B 33/00* (2006.01)
    *C30B 29/58* (2006.01)
    *D01F 9/16* (2006.01)
    *B82Y 30/00* (2011.01)
(52) U.S. Cl.
    CPC .......... *D01F 9/16* (2013.01); *B82Y 30/00* (2013.01); *C08J 2301/02* (2013.01); *C08J 2461/24* (2013.01); *C08J 2461/28* (2013.01)

(56) References Cited

OTHER PUBLICATIONS

Akhlaghi S. P. et al.,"Synthesis of amine finctionalized cellulose nanocrystals: optimization and characterization" Carbohydrate Research, vol. 409, May 29, 2015, pp. 48-55.
Wu Y. et al.,Monodispersed or narrow-dispersed melamine-formaldehyde resin polymer colloidal spheres: Preparation, size-control, modification, bioconjugation and particle formation mechanism,Journal of Materials Chemistry B, vol. 1, Jan. 14, 2013, pp. 204-212.
*International Search Report (PCT/ISA/210) dated Oct. 28, 2016, by the Canadian Patent Office as the International Searching Authority for International Application No. PCT/CA2016/050888.

* cited by examiner

PROCESSES FOR PREPARING AMINE-FUNCTIONALIZED CELLULOSE NANOCRYSTALS AND NITROGEN DOPED CARBON NANOFIBERS

CROSS REFERENCE TO RELATED APPLICATION

This application claims priority from U.S. 62/197,815 filed Jul. 28, 2015, the content of which is incorporated herein by reference.

FIELD OF THE DISCLOSURE

The present disclosure relates to a process for preparing coated cellulose nanocrystals (CNCs) obtainable by the process described herein. The disclosure further relates to a method to fabricate N-doped carbon nanomaterial from the coated CNCs.

BACKGROUND OF THE DISCLOSURE

Cellulose nanocrystals (CNCs) are obtained by the acid hydrolysis of native cellulose using an aqueous inorganic acid, such as sulphuric acid. Upon the completion (or near completion) of acid hydrolysis of the amorphous regions of native cellulose, individual rod-like cellulose crystallites of nanometer dimensions (commonly referred to as cellulose nanocrystals (CNCs)) that are insensitive to acidic environment are obtained. CNC possesses excellent mechanical properties, biodegradability and biocompatibility with a diameter ranging between 5 and 20 nm and length ranging to a few hundred nanometers.

The hydrolysis of cellulose using sulphuric acid leads to the formation of sulfate ester groups generating numerous negative charges on the surface of CNCs. These negative charges on the surface of CNCs promote uniform dispersion of nanocrystals due to electrostatic repulsion in aqueous solutions. The functionalization or coating of CNC with polymers or oligomers has been pursued however, many methods involve reaction systems that are difficult to scale industrially.

Carbon fiber that is lightweight and good in mechanical strength has become an attractive material for a wide variety of advanced applications. Most of the carbon fibers are currently produced through the carbonization of the petroleum-based polyacrylonitrile (PAN) as the dominant precursor but PAN has the drawback of being costly and high in alkaline metal content.

SUMMARY OF THE DISCLOSURE

In one aspect, there is provided a process for preparing coated cellulose nanocrystals (CNCs) said process comprising:
ia) mixing a reactive aldehyde with a polyamine compound under an alkaline pH and, optionally with heating; ib) combining the mixture from step ia) with a dispersion of CNCs in an aqueous medium; and ic) adjusting the resulting mixture of step ib) to an acidic pH; or
iia) mixing a dispersion of CNCs in an aqueous medium with a reactive aldehyde and a polyamine compound under an alkaline pH and, optionally with heating and iib) adjusting the mixture of step iia) to an acidic pH; and
isolating said coated CNCs after step ic) or step iib).

In a further aspect, there is provided a coated cellulose nanocrystals (CNCs) as defined herein or as prepared by the process defined herein.

In one aspect, there is provided a process for producing a nitrogen-doped carbon nanomaterial comprising: carbonizing coated cellulose nanocrystals (CNCs) as defined herein or as prepared by the process defined herein.

In a further aspect, there is provided a nitrogen-doped carbon nanomaterial obtained from a carbonization step of coated CNCs as defined herein or as prepared by the process defined herein.

DESCRIPTION OF THE DRAWINGS

The present disclosure is illustrated with reference to the following drawings, in which.

DETAILED DESCRIPTION OF THE DISCLOSURE

Figure 1:
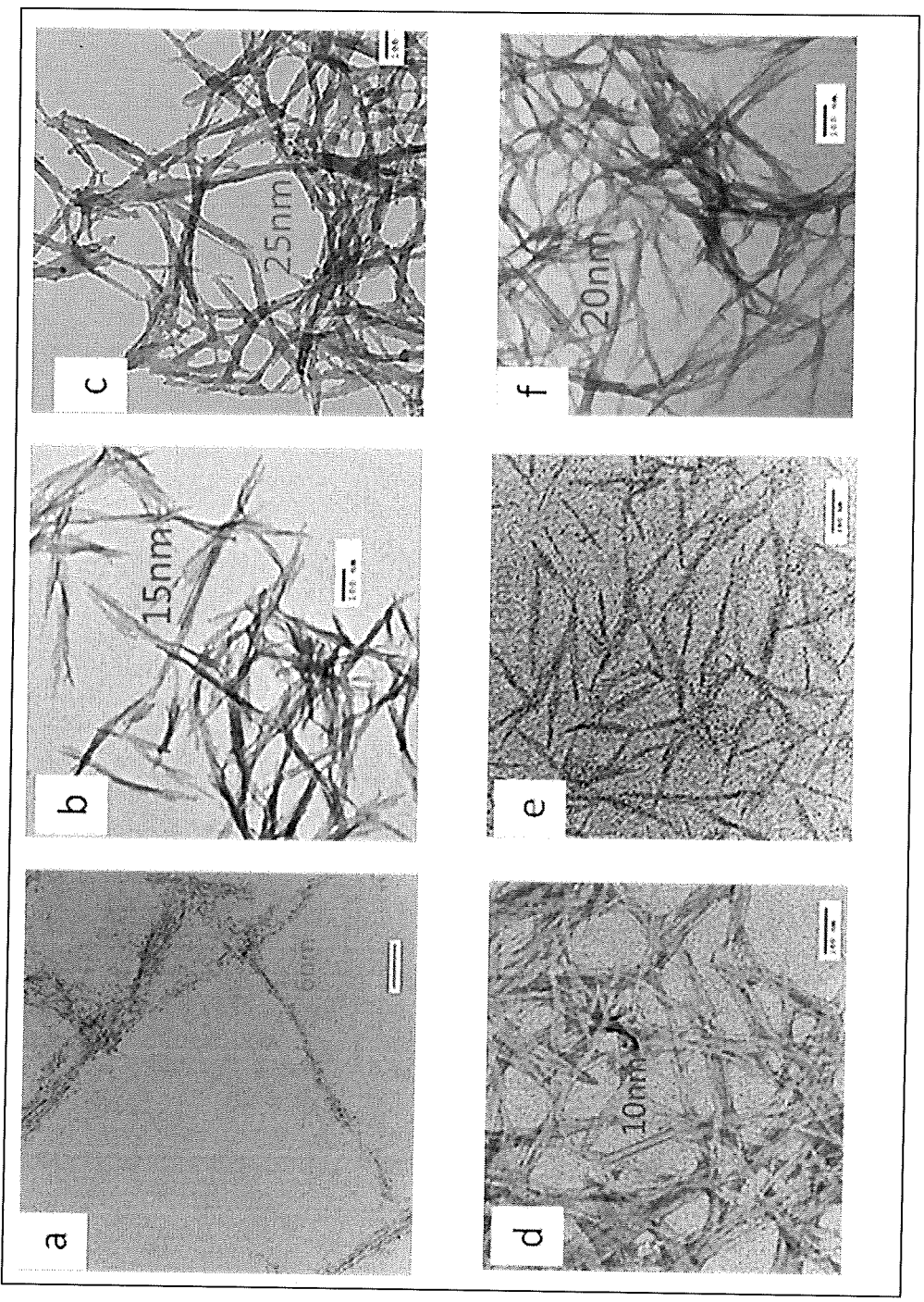
FIGS. 1a-f are TEM images of melamine formaldehyde (MF) resin and urea formaldehyde (UF) resin functionalized cellulose nanocrystals (CNC)

This disclosure describes a method to functionalize CNC with a one-step or two-steps reaction protocol in water which provides a CNC functionalization method while maintaining the high surface area of CNC. Polyamine compounds (such as melamine and urea), with reactive aldehydes (such as formaldehyde and glyoxal), can be coated on CNCs. Examples of polyamine/aldehyde reagents include melamine-formaldehyde (MF), urea-formaldehyde (UF) or melamine-urea formaldehyde (MUF).

The resultant coated CNCs possess high amine content and high surface area allowing them many potential applications.

As an example of application, the obtained coated CNCs may be further exposed to the carbonization treatment under inert atmosphere providing a porous carbon nanofiber with high nitrogen doping content. The proposed method may provide increased simplicity and cost-effectiveness of the experimental materials and conditions, as well as the efficient doping for the end product (i.e. carbon nanofiber). The N-doped carbonized material is believed to be promising for a wide range of electrochemical applications including the electrode material for supercapacitors and batteries, catalysts, and sensors.

In one embodiment, there is provided a process for preparing coated cellulose nanocrystals (CNCs) said process comprising:
ia) mixing formaldehyde with one or both of urea and melamine under an alkaline pH and, optionally with heating; ib) combining the mixture from step ia) with a dispersion of CNCs in an aqueous medium and ic) mixing the resulting mixture of step ib) under an acidic pH; or
iia) mixing a dispersion of CNCs in an aqueous medium with formaldehyde and one or both of urea and melamine under an alkaline pH and, optionally with heating and iib) adjusting the mixture of step iia) to an acidic pH and mixing the resulting mixture; and isolating said coated CNCs after step ic) or step iib).

In one embodiment, there is provided a process for preparing coated cellulose nanocrystals (CNCs) said process comprising:
  ia) mixing formaldehyde with one or both of urea and melamine under an alkaline pH and, optionally with heating; ib) combining the mixture from step ia) with a dispersion of CNCs in an aqueous medium and ic) mixing the resulting mixture of step ib) under an acidic pH; and
  isolating said coated CNCs after step ic).

In one embodiment, there is provided a process for preparing coated cellulose nanocrystals (CNCs) said process comprising:
  iia) mixing a dispersion of CNCs in an aqueous medium with formaldehyde and one or both of urea and melamine under an alkaline pH and, optionally with heating and iib) adjusting the mixture of step iia) to an acidic pH and mixing the resulting mixture; and
  isolating said coated CNCs after step iib).

As used herein, examples of polyamine compounds include melamine and urea.

As used herein, examples of reactive aldehydes include formaldehyde and glyoxal.

It is believed that there is a need for coated CNC nanoparticles. The functionalization of CNC with amine groups by this approach is expected to allow, for example, further reaction with epoxy or aldehyde derivatives, the absorption of negatively charged moieties and the preparation of N-doped carbon material that may be useful for water treatment applications, electrochemical applications including the electrode material for supercapacitors and batteries, catalysts, and sensors.

The present disclosure relates to the synthesis of coated cellulose nanocrystals (CNCs) (such as MF, UF and MUF-coated CNC), where the MF, UF and MUF could act as a substrate for further conjugation or electrostatic complexation with various functional moieties such as free metal ions, carboxylic acids, epoxy, and aldehyde derivatives. It is recognised that this substrate will also be an absorbent for negatively charged contaminants in waste water and be the basis for a high N-doped carbon material.

It is believed that the following advantages may be derived from the materials that are described in this present disclosure:
  High water dispersibility and surface area which render the CNCs suitable templates for preparing various functional polymers with predictably high surface area.
  High surface coating with secondary and tertiary amines, where the amines can effectively transform the CNC's surface charge from negative to positive under mild conditions. The secondary amine coating will allow the production of epoxy and aldehyde derivatives while the secondary and tertiary amine coatings will allow the absorption of negatively charged moieties and the preparation of N-doped carbon materials.

Preferably, in steps ic) and iib), mixing is used to ensure uniformity of the resulting mixture.

Preferably, in the above, the aqueous medium is deionized water. Preferably, the concentration of CNC in water is from about 0.1 to about 5.0 wt %, and more preferably from about 0.25 to about 3.0 wt %.

Preferably, in the above process, the aqueous medium for mixing formaldehyde with one or both of urea and melamine is deionized water. Preferably, the concentration of MF or UF or MUF precursor in water is from about 1 to about 100 wt % and, more preferably, 20 to about 80.0 wt %.

Preferably, the temperature in the heating step ia) or iia) is from about 10 to about 100° C. and, more preferably, from about 50 to about 90° C.

Preferably, the time of mixing in step ia) or step iia) is from about 10 to about 200 mins and, more preferably, from about 20 to about 120 mins.

Preferably, in the above process, said alkaline pH is from about 7 to about 10 and, more preferably, the pH is from about 8 to about 9.

Preferably, in the above process, the acidic pH is from about 2 to about 7 and, more preferably, from about 3 to about 5. This pH can be adjusted by acids such as hydrochloric, formic, acetic, and nitric acids.

Preferably, in the above process, the mixing at step ic) or step iib) is at a temperature of from about 10 and 100° C. and, more preferably, from about 50 to about 90° C.

Preferably, in the above process, the time of mixing at step ic) or step iib) is about 0.5 to about 48 h and, more preferably, from about 1 to about 12 h.

Preferably, in the above method for producing the MF or UF or MUF-coated CNCs, the concentration of MF or UF or MUF in the final mixture (i.e. the mixture of the CNC solution with MF solution or UF solution) is about 1 to about 20 wt %, and more preferably from about 3 to about 10 wt % is used in an amount of from about 1 to about 20 wt %, and more preferably from about 3 to about 10 wt %.

In the above process said coated CNC can be isolated by: including, but not limited to, precipitation or filtration or centrifugation or a combination of them.

In one aspect, there is provided a MF or UF or MUF coated cellulose nanocrystals (CNCs) obtainable by the method defined herein.

In one aspect, there is provided a MF or UF or MUF coated cellulose nanocrystals (CNCs) as defined herein.

In one embodiment, there is provided a process for producing a nitrogen-doped carbon nanomaterial comprising:
  (i) drying the coated cellulose nanocrystals (CNCs) as defined herein or as prepared by the process defined herein;
  (ii) carbonizing the dried coated cellulose nanocrystals (CNCs) of step (i) in a furnace under inert gas at high temperature; and
  (iii) cooling down the material resultant from step (ii) under inert atmosphere.

In one embodiment of the process for producing the nitrogen-doped carbon nanomaterial the coated CNCs as defined herein or as prepared by the process defined herein after isolation (e.g. by filtration or centrifugation or a combination of these) is redispersed in water before the step (i) of drying.

In one embodiment of the process for producing the nitrogen-doped carbon nanomaterial the coated CNCs is redispersed in water at a concentration of 0.001-50.00 wt % or alternatively 0.01-2.0 wt %. In the process for producing the nitrogen-doped carbon nanomaterial, step (i) of drying CNCs is conducted by any appropriate method, including without limitation freeze drying or spray drying.

The carbonization step (ii) in the present disclosure can be conducted at a range of temperatures as long as it allows carbonization of the coated CNCs. Carbonization provides the conversion of the coated CNCs as described herein into a nitrogen-doped carbon substance. In one embodiment, step (ii) of carbonizing can be conducted at a temperature from about 300 to about 1200 degree, preferably under about 1000, such as from about 500 to about 1000 degrees or about 500 to about 900 degrees. The carbonization temperatures in the present disclosure can be reached by increasing the temperature of the sample from room temperature to the desired carbonization temperatures. For example, a continuous temperature increase can be used, such as at a rate of 5 to 10° C./min and for example 10° C./min. However equipment do not have such control and can still be used.

In the process for producing the nitrogen-doped carbon nanomaterial described herein, the inert gas useful for removing oxygen before carbonization, during carbonization and cooling steps can be the same or different. From a practical standpoint, it is advantageously the same gas. The gas can be inert gas such as nitrogen, carbon dioxide, helium, xenon and argon.

Figure 4:
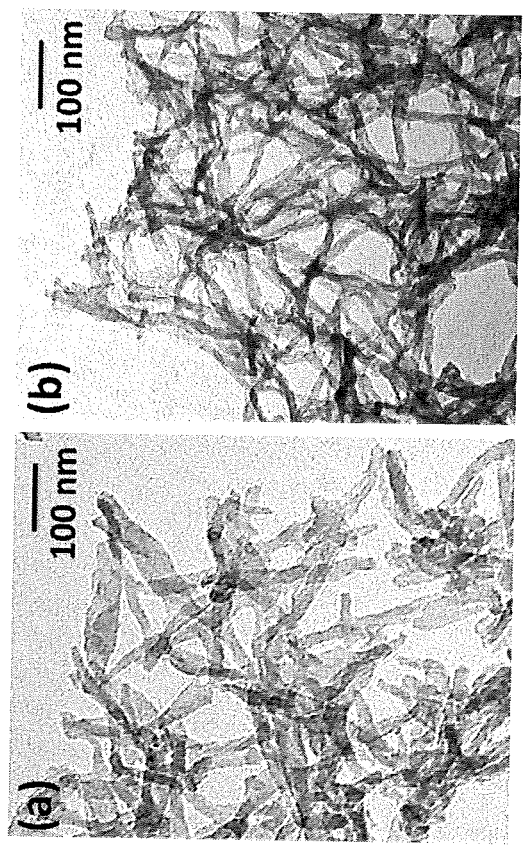
FIGS. 4(a)-(b) show the TEM images of MF-CNC after pyrolysis at 800 and 900 degrees.

The process as defined herein allows for obtaining a nitrogen-doped carbon nanomaterial, especially a rod-like structure nanomaterial FIG. 4 shows the TEM image of the sample carbonized at 900° C.

Although CNCs) used herein are obtained by the acid hydrolysis of native cellulose using an aqueous inorganic acid (e.g. sulphuric acid hydrolysis). CNC-like materials can be produced by other methods and these CNC derivatives are also contemplated as being useful in the present disclosure.

In the examples below CNCs were obtained from Celluforce Inc. (Montreal, Quebec Canada). The other chemicals such as melamine, formaldehyde, urea, formic acid, and hydrochloric acid were purchased from Sigma-Aldrich Co., and used as received.

The scale bars of the TEM images in FIG. 1 are 100 nm.

EXAMPLE 1

MF Precursor Preparation

The preparation of MF precursor is described below:
2.2 g of melamine and 4.0 mL of formaldehyde (37% in water) were mixed in 10 mL deionized water in a 50 mL flask, followed by pH adjustment to 8-9 using NaOH solution. The temperature was increased to 80° C. with mechanical or magnetic stirring for 30 mins. The solution turns from cloudy to transparent within 5 mins. After 30 mins, the precursor is ready for the next reaction step.

EXAMPLE 2

UF Precursor Preparation

The preparation of UF precursor is described below:
1.0 g of urea and 2.85 mL of formaldehyde (37% in water) were mixed in 5 mL deionized water in a 50 mL flask, followed by pH adjustment to 8 using NaOH solution. The temperature was increased to 80° C. with mechanical or magnetic stirring for 30 mins. After 30 mins, the precursor is ready for the next reaction step.

EXAMPLE 3

MUF Precursor Preparation

The preparation of the MUF precursor is described as below:
10 ml MF precursor from Example 1 and 5 mL UF precursor from Example 2 were mixed together.

EXAMPLE 4

Preparation of MF Coated CNC (MFCNC1) Hybrid in One Step

The preparation of MFCNC1 in one step is described below:
10 ml 3% CNC water suspension with 1.1 g of melamine and 2 mL of formaldehyde (37% in water) were mixed together and NaOH solution (0.1M) was added to adjust the pH to between 8 and 9. The temperature was increased to 80° C. and stirring was continued for between 1 and 2 h. 40 mL deionized water was added to the mixture and the pH was adjusted to pH 4 with hydrochloric acid solution. The reaction was maintained at 60° C. for a further 2 h. The reaction was stopped by cooling to room temperature and the product was separated by filtration and washed with deionized water for 3 times. Then it was redispersed in 100 ml water, and freeze-dry the resultant solution to give a white powder. The product morphology was characterized by transmission electron microscopy (TEM), and the images are shown in FIG. 1b. Compared to the original CNCs, FIG. 1a, with a diameter around 6 nm, the diameter of the MFCNC1 hybrid increased to around 15 nm, indicating successful coating.

EXAMPLE 5

Preparation of MF Coated CNC (MFCNC2) Hybrid in Two Steps

The preparation procedure for MFCNC2 in two steps is described below:
14 mL of the product from Example 1 was mixed with 100 mL 1% CNC suspension. The pH was adjusted to between 4 and 5 with hydrochloric acid solution. The temperature was increased to 80° C. and reaction was allowed to continue for between 1 and 10 h with stirring with between 1 and 2 hours being optimum. The reaction was stopped by cooling to room temperature and the product was separated by filtration and washed with DI water for 3 times. The product morphology was characterized by transmission electron microscopy (TEM), and the images are shown in FIG. 1c. Compared to the original CNCs with a diameter around 6 nm (FIG. 1a), the diameter of MFCNC2 increased to around 25 nm, indicating successful coating.

The BET surface area of MFCNC2 was characterized by a nitrogen gas adsorption method, and it showed a BET surface area of 212.8 m$^2$/g which is in the same range as the BET surface area measured for pure CNCs.

Figure 3:
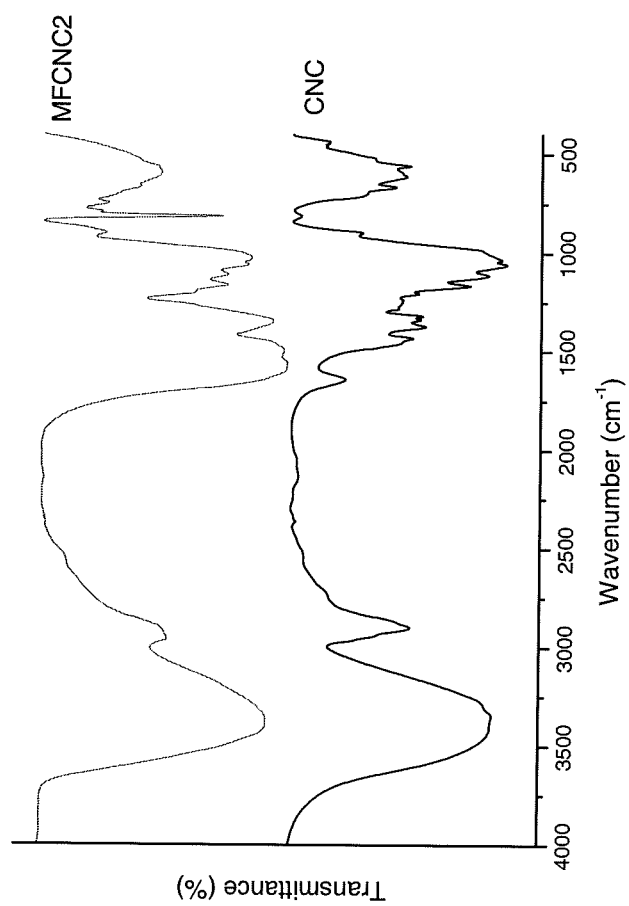
FIG. 3 is the FT-IR spectra of CNC and MF resin functionalized CNC.

The MF content in MFCNC2 was determined by thermogravimetric analysis (TGA), which was shown in FIG. 3. The thermo degradation curves of freeze-dried CNC and freeze-dried MFCNC2 revealed that the residue at 600° C. was 14.6% for freeze-dried CNC, 25.6% for freeze-dried MFCNC2, and 33.5% for pure MF resin prepared here. From this information, the MF resin content of MFCNC2 was calculated to be 58% and CNC content is 42% based on the following equations:

$$C_{CNC}+C_{MF}=1$$

$$0.146 C_{CNC}+0.335 C_{MF}=0.256$$

where, $C_{CNC}$ is the content of CNC in MFCNC2, and $C_{MF}$ is the content of MF in MFCNC2.

The composition of the MFCNC2 sample was further confirmed by FT-IR analysis, and comparative spectra are shown in FIG. 3. The FT-IR spectrum of MFCNC2 is clearly different from the spectrum of pure-CNC. Two peaks from the 1, 3, 5-striazine ring (at 1556 and 812 cm$^{-1}$) of melamine were evident in the MFCNC2 spectrum. (Youshen, Wu et al., *J. Mater. Chem. B*, 2013, 1, 204-212).

The zeta-potential test results listed in Table 1 also showed that after coating CNC with MF, its surface charge changed from −40 mV (CNC) to +35 mV at pH lower than 7, which confirmed the successful coating of CNC.

TABLE 1

| pH | 2.86 | 4.49 | 7.00 | 9.16 | 11.00 |
|---|---|---|---|---|---|
| Zeta Potential/mV | 38.4 ± 4.1 | 39.0 ± 2.8 | 35.8 ± 1.9 | 27.7 ± 4.2 | −9.7 ± 3.8 |

EXAMPLE 6

Preparation of UF Coated CNC (UFCNC1) Hybrid in Two Steps

The preparation procedure for UFCNC1 in two steps is described below:

8 mL of the product from Example 2 was mixed with 50 mL of 1% CNC suspension. The pH was adjusted to pH 3 with formic acid water solution. The temperature was increased to 80° C. and reaction was continued for between 2 and 24 h with stirring with between 2 and 5 h being optimum. The reaction was stopped by cooling to room temperature and the product was separated by filtration and washed with DI water 3 times. The product morphology was characterized by TEM, and the images are shown in FIG. 1d. Compared to the original CNCs with a diameter around 6 nm (FIG. 1a), the diameter of the UFCNC1 hybrid increased to around 10 nm, indicating successful coating.

EXAMPLE 7

Preparation of UF Coated CNC (UFCNC2) Hybrid in Two Steps

The preparation procedure for UFCNC2 in two steps is as follows:

8 mL of the product from Example 2 was mixed with 50 niL of 1% CNC suspension. Another 1.0 g urea was added and the pH adjusted to 3 with formic acid solution. The temperature was increased to 60° C. and reaction was continued for between 2 and 24 h with stirring with between 2 and 5 h being optimum. The reaction was stopped by cooling to room temperature and the product was separated by filtration and washed with DI water 3 times. The product morphology was characterized by TEM, and the images are shown in FIG. 1e. Compared to the original CNCs with diameter around 6 nm (FIG. 1a), the diameter of UFCNC2 increased to around 13 nm, indicating successful coating.

EXAMPLE 8

Preparation of MUF Coated CNC (MUFCNC1) Hybrid in Two Steps

The preparation procedure for MUFCNC1 in two steps is described below:

15 mL of the product from Example 3 was mixed with 150 mL of 1% CNC suspension. The pH was adjusted to pH 3 with hydrochloric acid solution. The temperature was increased to 80° C. and reaction was allowed to continue for between 2 and 24 h with stirring with between 2 and 5 h being optimum. Then the reaction was stopped by cooling to room temperature and the product was separated by filtration and washed with DI water 3 times. The product morphology was characterized by TEM, and the images are shown in FIG. 1f. Compared to the original CNCs with a diameter around 6 nm (FIG. 1a), the diameter of MUFCNC1 increased to around 20 nm, confirming successful coating.

EXAMPLE 9

Carbonization of MF-CNC

Figure 2:
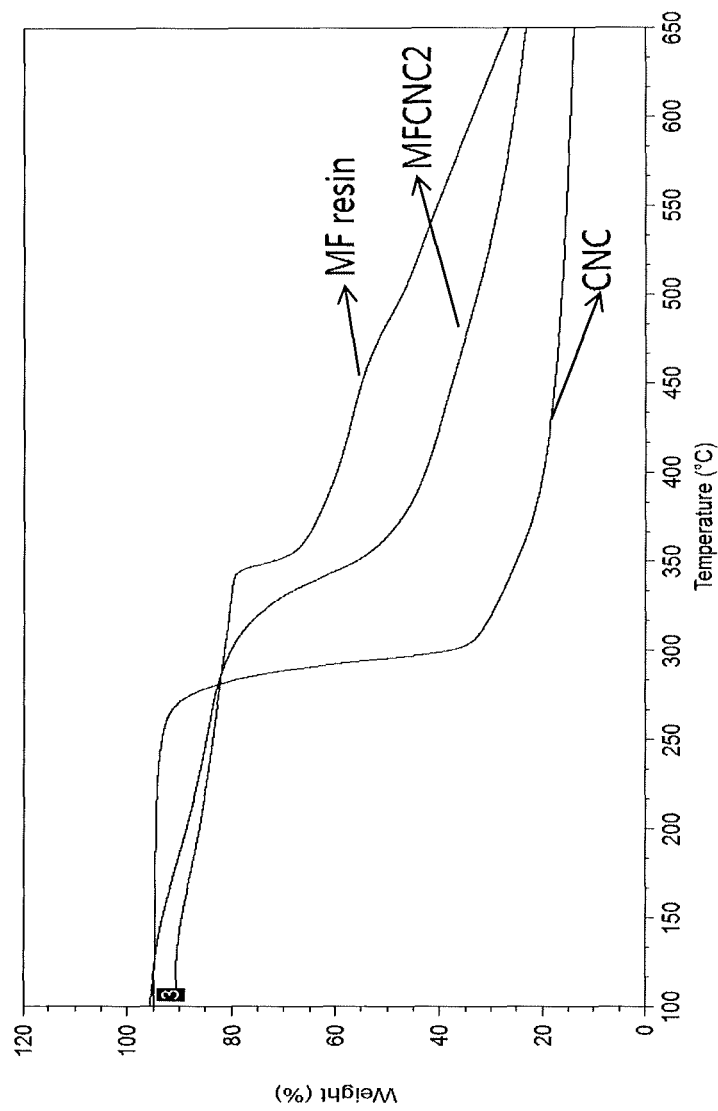
FIG. 2 is the TGA curves of CNC and MF resin functionalized CNC.

MFCNC prepared as described in Example 5 was freeze dried. The product morphology was characterized by transmission electron microscopy (TEM), and the images are shown in FIG. 1c. The CNCs after MF coating maintain the well-dispersed rod shape with slightly increased diameter due to MF coating. TGA thermal analysis for MF-CNC in FIG. 2 showed that a most significant mass loss occurs at temperature less than 300° C., which is due to dehydration and elimination of hydroxyl groups. At a higher temperature, the weight loss became more moderate where the evaporation of small volatile fragments and the rearrangement in the carbon frame to produce graphite structure took place.

The freeze-dried MF-CNCs was added into a quartz tube and then introduced into a high-temperature furnace, with argon gas flow operated for 30 minutes to 1 hour to remove oxygen from the reactor at room temperature.

Subsequently, the quartz tube was heated to a temperature of 600-900° C. from room temperature at a heating rate of 5 C/min.

The reactor was heated to the heat treatment temperature, maintained for 1 to 2 hours, and then allowed to cool to room temperature within 2 hrs.

Continuous inert gas flow is maintained during the heat treatment from the room temperature until the end of the cooling cycle.

FIG. 4 showed the TEM image of the carbonized MF-CNC sample carbonized at 900° C. The rod-like structure was retained up to this high temperature.

Figure 5:
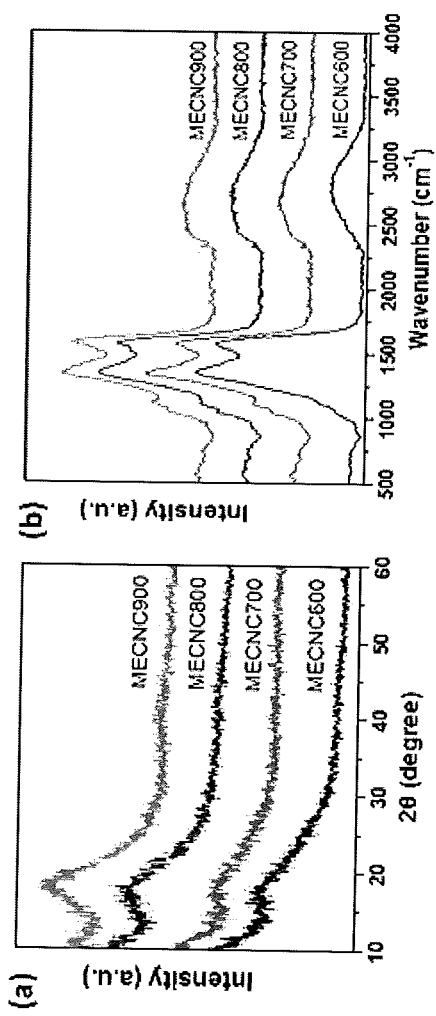
FIGS. 5(a)-(b) show the results of (a) XRD and (b) Raman analysis of carbonized MF-CNC nanofibers.

FIG. 5 showed the results of XRD and RAMAN analysis for the carbonized MF-CNC operated at various temperatures. With the increasing carbonization temperature, the most relevant characteristic peak at 2θ=17.8 degrees showed an increase in intensity and a decrease in the full width at half-maximum. The evidence suggested a higher graphitization degree with higher carbonization temperature. The RAMAN spectra showed a reduction in the integral peak intensity of D band and G band with increasing carbonization temperature implying an increased structural order obtained for the MF-CNC pyrolysed at a higher temperature.

The BET and Elemental Analysis of carbonized MF-CNC at 700 degrees showed a surface area of 392.7 m$^2$/g and a high nitrogen doping content of 22.58%. The nitrogen doping retains as high as 15.6% at MFCNC 800 degrees, 8.45% at 900 degrees and 4.28% at 1000 degrees. MFCNC900 demonstrates a specific surface area of 564.2 m2/g.

The invention claimed is:

1. A process for preparing coated cellulose nanocrystals (CNCs) said process comprising:
   ia) mixing a reactive aldehyde with a polyamine compound under an alkaline pH, and optionally with heating; ib) combining the mixture from step ia) with a dispersion of CNCs in an aqueous medium; and ic) adjusting the resulting mixture of step ib) to an acidic pH;

or iia) mixing a dispersion of CNCs in an aqueous medium with a reactive aldehyde and a polyamine compound under an alkaline pH and, optionally with heating and iib) adjusting the mixture of step iia) to an acidic pH; and isolating said coated CNCs after step ic) or step iib).

2. The process of claim 1, wherein the aqueous medium is deionized water.

3. The process of claim 2, wherein the concentration of CNC in water is from about 0.1 to about 5.0 wt %.

4. The process of claim 1, wherein said polyamine compound is comprising melamine, urea or a mixture thereof.

5. The process of claim 1, wherein said reactive aldehyde is comprising formaldehyde, glyoxal or a mixture thereof.

6. The process of claim 1, wherein said heating step ia) or iia) is from about 10 to about 100° C.

7. The process of claim 1, wherein said mixing in step ia) or step iia) is from about 10 to about 200 mins.

8. The process of claim 1, wherein said alkaline pH is from about 7 to about 10.

9. The process of claim 1, wherein said acidic pH is from about 2 to about 7.

10. The process of claim 1, wherein said adjusting the mixture to an acidic pH is conducted with an acid selected from the group consisting of hydrochloric, formic, acetic, and nitric acids.

11. The process of claim 1, wherein said isolating step is comprising precipitation, filtration or centrifugation, or a combination thereof.

12. A coated cellulose nanocrystals (CNCs) prepared by the process as defined in claim 1.

13. A process for producing a nitrogen-doped carbon nanomaterial comprising: carbonizing coated cellulose nanocrystals (CNCs) claim 1.

14. A process for producing a nitrogen-doped carbon nanomaterial, comprising:
 a) preparing coated cellulose nanocrystals (CNCs) according to a process comprising:
  ia) mixing a reactive aldehyde with a polyamine compound under an alkaline pH and, optionally with heating; ib) combining the mixture from step ia) with a dispersion of coated cellulose nanocrystals (CNCs) in an aqueous medium; and ic) adjusting the resulting mixture of step ib) to an acidic pH;
 or
  iia) mixing a dispersion of CNCs in an aqueous medium with a reactive aldehyde and a polyamine compound under an alkaline pH and, optionally with heating and iib) adjusting the mixture of step iia) to an acidic pH;
 isolating said coated CNCs after step ic) or step iib);
 b) drying the coated CNCs;
 c) carbonizing the dried coated CNCs in a furnace under inert gas at a temperature of from about 300 to about 1200 degrees Celsius; and
 d) cooling down the carbonized, dried coated CNCs material resultant from step (ii) under inert atmosphere.

15. The process for producing a nitrogen-doped carbon nanomaterial as defined in claim 14, wherein said coated CNCs is redispersed in water before the drying step.

16. The process for producing a nitrogen-doped carbon nanomaterial as defined in claim 15, wherein the coated CNCs is redispersed in water at a concentration of 0.001-50.00 wt %.

17. The process for producing a nitrogen-doped carbon nanomaterial as defined in claim 14, wherein said drying step of CNCs comprises freeze drying or spray drying.

18. The process for producing a nitrogen-doped carbon nanomaterial as defined in claim 14, wherein said step (ii) of carbonizing is conducted at a temperature from about 500 to about 1000 degrees Celsius.

19. The process for producing a nitrogen-doped carbon nanomaterial as defined in claim 14, wherein said inert gas or inert atmosphere in said carbonization and cooling steps is each independently selected from nitrogen, carbon dioxide, helium, xenon and argon.

20. The process of claim 14, wherein the aqueous medium is deionized water and said CNC is at a concentration from about 0.1 to about 5.0 wt % in said deionized water.

21. The process of claim 14, wherein said polyamine compound is comprising melamine, urea or a mixture thereof.

22. The process of claim 14, wherein said reactive aldehyde is comprising formaldehyde, glyoxal or a mixture thereof.

23. The process of claim 14, wherein said heating in said step ia) or iia) is from about 10 to about 100° C.

24. The process of claim 14, wherein said mixing in step ia) or step iia) is from about 10 to about 200 mins.

25. The process of claim 14, wherein said alkaline pH is from 7 to about 10.

26. The process of claim 14, wherein said acidic pH is from about 2 to <7.

27. The process of claim 14, wherein said adjusting the mixture to an acidic pH is conducted with an acid selected from the group consisting of hydrochloric, formic, acetic, and nitric acids.

* * * * *